(12) United States Patent
Landry et al.

(10) Patent No.: US 6,507,932 B1
(45) Date of Patent: *Jan. 14, 2003

(54) METHODS OF CONVERTING AND/OR TRANSLATING A LAYOUT OR CIRCUIT SCHEMATIC OR NETLIST THEREOF TO A SIMULATION SCHEMATIC OR NETLIST, AND/OR OF SIMULATING FUNCTION(S) AND/OR PERFORMANCE CHARACTERISTIC(S) OF A CIRCUIT

(75) Inventors: Greg J. Landry, Merrimack, NH (US); Alan Hawse, Georgetown, KY (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/347,074

(22) Filed: Jul. 2, 1999

(51) Int. Cl.[7] .................................................. G06F 17/50
(52) U.S. Cl. ............................................................ 716/3
(58) Field of Search ............................... 716/3, 1, 2, 4; 703/14, 22

(56) References Cited

U.S. PATENT DOCUMENTS

| | | | | |
|---|---|---|---|---|
| 5,903,469 A | * | 5/1999 | Ho .................................. | 716/5 |
| 5,999,726 A | * | 12/1999 | Ho ................................. | 716/11 |
| 6,009,252 A | * | 12/1999 | Lipton .......................... | 716/5 |
| 6,099,581 A | * | 8/2000 | Sakai .......................... | 716/11 |
| 6,128,768 A | * | 10/2000 | Ho .................................. | 716/5 |
| 6,243,653 B1 | * | 6/2001 | Findley ...................... | 702/65 |

* cited by examiner

Primary Examiner—John F. Niebling
Assistant Examiner—Stacey A Whitmore
(74) Attorney, Agent, or Firm—Christopher P. Maiorana, P.C.

(57) ABSTRACT

A method of converting or translating a layout or schematic netlist to a simulation netlist, comprising the steps of identifying net-shorting elements in the layout or schematic netlist and automatically replacing at least one such net-shorting element with an RC network to generate the simulation netlist.

20 Claims, 2 Drawing Sheets

METHODS OF CONVERTING AND/OR TRANSLATING A LAYOUT OR CIRCUIT SCHEMATIC OR NETLIST THEREOF TO A SIMULATION SCHEMATIC OR NETLIST, AND/OR OF SIMULATING FUNCTION(S) AND/OR PERFORMANCE CHARACTERISTIC(S) OF A CIRCUIT

SUMMARY

The present invention concerns a method of simulating and/or predicting the function(s) and/or performance of a circuit, particularly an integrated circuit, and/or of increasing the accuracy of existing method(s) of simulating and/or predicting the function(s) and/or performance of a circuit. The present invention concerns a computer-readable set of instructions for performing such a method.

DISCUSSION OF THE BACKGROUND

A major failure mode of current circuit design methodologies is the simulation of different schematics than are used for a Layout Versus Schematic, or LVS, tapeout process. Currently known design techniques for predicting circuit performance from the initial circuit design require a manual process, either in the manual creation of simulation schematics from LVS schematics, or in the manual comparison of simulation and LVS schematics to determine mismatches. Disadvantages of the old technology include:

The time required to hand-create a simulation schematic

The time required to compare the layout to the simulation schematics to ensure that they have the same function The risks inherent to a manual process The current problem is that designers would like to model resistance and capacitance of interconnect wires for simulation purposes without being required to match these devices in the layout. However, currently available LVS tools require there to be a 1:1 mapping of schematic elements to extracted layout elements. As a result it is impossible to insert the desired parasitic elements for simulation purposes without causing LVS mismatches. With the invention of simulation tools that are capable of simulating entire integrated circuits or full chips, it is desirable to simulate using the same schematics as are used for layout.

Purpose

The present invention allows automated conversion of layout (or LVS) schematics to simulation schematics.

For instance, in the example shown in FIG. 1, it is desirable have one schematic which behaves like the schematic of FIG. 1(A) for LVS, and behaves like the schematic of FIG. 1(B) for simulation. The desired netlists for each tool (computer-readable software and/or code for modeling and/or predicting circuit function[s] and/or performance) are:

TABLE 1

Netlists for the input buffer of FIGS. 1(A)–(B).

| Schematic LVS Netlist | Layout LVS Netlist | Simulation Netlist |
| --- | --- | --- |
| INV1 A B | INV1 A B | INV1 A B |
| INV2 B C | INV2 B C | RES1 B D |
| | | INV2 D C |

TABLE 1-continued

Netlists for the input buffer of FIGS. 1(A)–(B).

| Schematic LVS Netlist | Layout LVS Netlist | Simulation Netlist |
| --- | --- | --- |
| | | C1 B GND |
| | | C2 D GND |

The most readily apparent problem is that the simulation and layout netlists do not match. This is true because of (a) the extra devices (i.e., the resistor and capacitors), and (b) the extra net "D" (the node D and its inherent RC characteristic[s]). It may be a relatively trivial exercise to remove the extra devices from the simulation netlist. However, it is extremely difficult to remove the extra net without causing severe LVS mismatching and/or circuit modeling problems.

This invention provides a scheme (method and computer-readable and/or processor-executable software program) to automatically convert schematics that contain a net-shorting element to a new set of schematics that contain a resistor-capacitor (RC) network in place of the net-shorting element. In the present application, a "net-shorting element" may refer to a two-terminal shorting device that is not netlisted for layout (i.e., the "imaginary" connection between node B in each of the LVS netlists in Table 1 above). Such a net-shorting element is also known colloquially as a "patch cord." More specifically, a "net-shorting element" generally refers to a connection between two elements in the schematic having one or more inherent RC characteristic[s], which in some cases may refer to the inherent resistance and/or parasitic capacitance of the node, or of a bus section in the node.

Furthermore, in the present application, a "resistance-capacitance network" may generally refer to one or more RC circuits inserted between (a) two or more elements in the schematic, (b) two or more bus junctions in the schematic, or (c) one or more bus junctions and one or more elements in the schematic, that model one or more inherent and/or parasitic RC characteristics at the node between the schematic elements. Typically, an RC circuit in a "resistance-capacitance network" comprises a resistor and a capacitor between it and a schematic element, configured (for example) in the manner shown in FIG. 1(B).

This technique allows a circuit designer to:

Draw only one set of schematics

Automatically create simulation schematics

Ensure that the automatically-created schematics are correct

Simulate the desired interconnect parasitics

BRIEF DESCRIPTION OF THE DRAWINGS

These and other objects, features and advantages of the present invention will be apparent from the following detailed description and the appended claims arid drawings in which:

DESCRIPTION OF THE INVENTION

The overall process behind the invention may flow as follows:

The designer draws the circuit schematics

The designer inserts net-shorting elements (patch cords) where parasitic elements are expected and/or desired The net-shorting elements refer to or contain resistance and/or capacitance information for the technology to be used for circuit fabrication A computer-readable circuit schematic translating program (which may be commercially available) creates a new simulation library (or netlist) with copied versions of the schematics The new simulation schematics contain, in place of the net-shorting element, an RC network (having essentially the same RC characteristic[s] inherent to the circuit node identified in the layout or circuit schematic by the net-shorting element)

Thus, the present invention concerns a method of converting or translating a layout or schematic netlist to a simulation netlist, comprising the steps of:

identifying net-shorting elements in the layout or schematic netlist, and automatically replacing at least one such net-shorting element with an RC network to generate the simulation netlist.

The present invention also concerns a method of converting or translating a layout or circuit schematic to a simulation netlist, comprising the steps of:

identifying nodes in the layout or circuit schematic that have characteristic resistance and/or capacitance properties, inserting a net-shorting element in the corresponding layout or schematic cell, and automatically replacing at least one such net-shorting element with an RC network to generate the simulation netlist.

The present invention also concerns a method of converting or translating a layout or circuit schematic to a simulation schematic, comprising the steps of:

identifying nodes in the layout or circuit schematic that have characteristic resistance and/or capacitance properties, and automatically replacing at least one such node with an RC network to generate the simulation schematic.

Figure 1A:
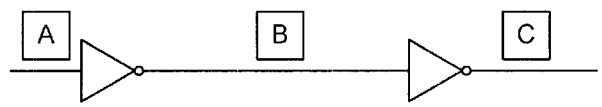
FIG. 1(A) is a diagram illustrating an example circuit used for a Layout Versus Schematic (LVS) tapeout process netlist.

Nodes that have characteristic and/or parasitic resistance and/or capacitance properties may be identified in a layout or circuit schematic netlist by conventional methods (e.g., the methods by which net-shorting elements are identified nodes to the appearance of the same node or net in at least two lines of the netlist (e.g., node "B" in FIG. 1(A) appearing in both lines of the exemplary layout and schematic netlists above).

Thus, the present invention allows designers to automatically convert layout to simulation schematics without incurring the time consumption of or risks inherent to hand creation or translation of simulation schematics.

The present invention also concerns a method of simulating and/or predicting, and/or of increasing the accuracy of existing method(s) of simulating and/or predicting the function(s) and/or performance of a circuit, particularly an integrated circuit, comprising the above method of converting or translating a layout or netlist to a simulation schematic or netlist, and the further steps of:

simulating the function(s) and/or performance of a circuit in response to at least one simulated input signal over a plurality of simulated operational extreme conditions.

Figure 2:
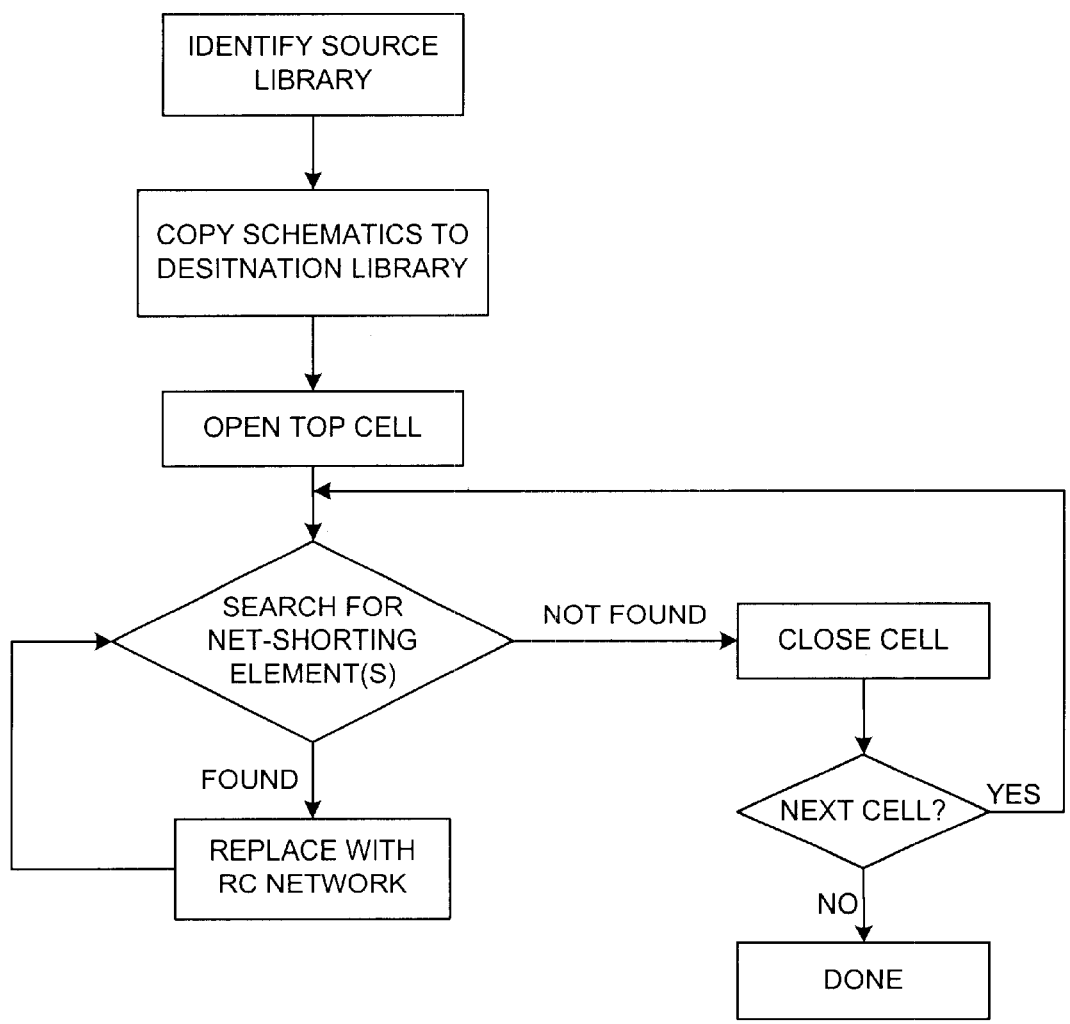
FIG. 2 is a flow diagram illustrating a process in accordance with a preferred embodiment of the present invention.

The detailed method can be summarized in the flow chart shown in FIG. 2. One first identifies and/or selects a source library (comprising a plurality of cell files, each cell representing one or more schematics in a functional block of circuitry for a chip to be designed, at least one cell file having at least one net-shorting element therein), then (electronically) copies the schematics in the selected source library to a destination library. The destination library is opened, then the first or top cell therein is opened. One then electronically searches the open cell file for net-shorting elements. Once identified, any net-shorting elements in the open cell are electronically (and preferably, automatically) converted to and/or replaced with an RC network as described above by a set of computer-readable instructions configured to carry out such an automatic conversion. After each of the net-shorting elements in the open cell is replaced with an RC network, the first cell file is closed. Thereafter, the next cell file in the destination library is opened, and the search-and-replace steps are repeated for the next cell file. This process continues (preferably automatically, carried out by the set of computer-readable instructions) until all cell files in the destination library have been searched and the net-shorting elements therein have been replaced with RC networks, thereby electronically (and preferably automatically) creating an accurate simulation netlist. An accurate set of simulation schematics may be created from the simulation netlist.

Figure 1B:
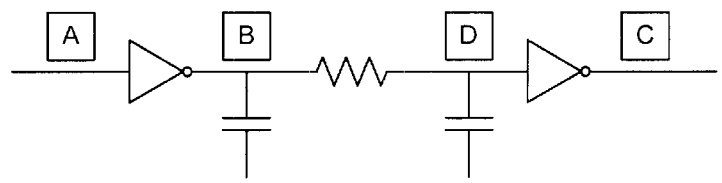
FIG. 1(B) is a diagram of a circuit used for a simulation netlist of the circuit shown in FIG. 1(A)

Those of ordinary skill in the relevant art(s) will appreciate the possible levels of circuitry that can be represented in a cell file. For example, a cell or cell file having characteristic information for (a) the circuit(ry) and/or schematic(s) therein and (b) the signal inputs and outputs (the I/O interface) thereof, may be represented as a single component in a larger schematic to be electronically represented in a new, larger cell/cell file. For example, each of the inverters in FIG. 1 can be independently replaced with the same or different cell, and a new cell file may be created from the serially-connected cells. For the circuit routing shown in FIG. 1, each cell would represent a circuit having one data input and one data output. Characteristic information for the cell, such as its resistance, capacitance, inductance, delay from input to output under typical and/or worst-case conditions, etc., and which may have already been determined by the present method, could then be used in simulation calculations for a larger circuit/schematic containing the cell to predict and/or determine overall performance of the circuit represented by the new, larger cell file.

Figure 3A:
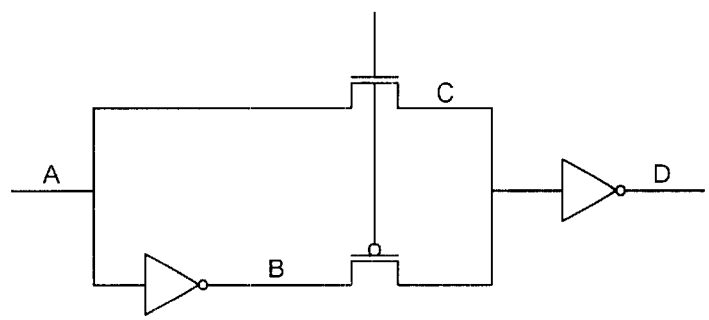
FIG. 3(A) is an example circuit used to illustrate where not shorting elements would be inserted when converting from LVS to simulation netlists.
Figure 3B:
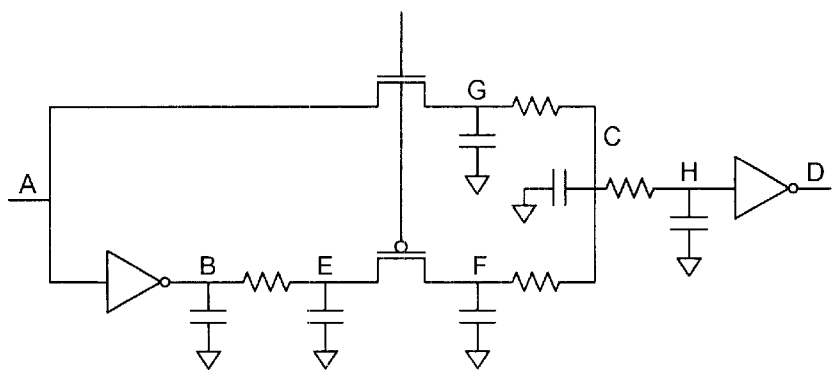
FIG. 3(B) is a diagram illustrating the circuit of FIG. 3A with net shorting elements added for a simulation netlist.

A circuit schematic for a buffered polarity multiplexer is shown in FIG. 3(A). The schematic and layout netlists for this buffered polarity multiplexer are shown in Table 2 below. A conventional layout-to-simulation netlist converting program may identify nodes B and C in the circuit of FIG. 3(A) as nodes requiring net-shorting elements (for example, as a result of the presence of the node identifier in more than one net, preferably in different order locations of different nets, where the order of nodes in the net corresponds to the flow of a data or signal path). Node B, which is connected to only two circuit elements and would have, or be represented by, a net-shorting element in a conventional LVS netlist, would be replaced with a simple one-resistor, two-capacitor RC network by the present instruction set for converting an LVS netlist to a simulation netlist, as shown in FIG. 3(B). In doing so, the present instruction set may automatically create a new node for one of the connections between the RC network resistor and one of the circuit elements to which node B is connected in the LVS schematic.

However, node C, which is branched and connected to three circuit elements, may have, or be represented by, three net-shorting elements in a conventional LVS netlist. In the present invention, the net-shorting elements at node C are replaced with an RC network more complex than that of node B (see FIG. 3(B)). In such a case, the present instruction set for converting an LVS netlist to a simulation netlist may either:

simply identify each net-shorting element, and replace it with a simple one-resistor, two-capacitor RC network; or determine the total number of net-shorting elements at a particular node, replace each with a resistor, insert a capacitor between each newly-added resistor and each circuit element in a net containing the node, then insert a capacitor at each bus junction on the node (as shown in FIG. 3(B)).

In doing so, the present instruction set may arbitrarily designate and/or identify one of the connections between either (a) a circuit component and an RC network resistor or (b) between two RC network resistors as the same node from the LVS schematic, then automatically create a new node for each of the remaining connections between the RC network resistors and circuit elements to which the node in the LVS schematic is connected.

Either technique can be applied to any circuit of any complexity. The examples presented herein were chosen for sake of clarity and simplicity.

The reverse method of translating a simulation schematic or netlist to a schematic or netlist, comprising the same steps in reverse, is contemplated by and within the scope of the present invention. Thus, the present invention also encompasses the reverse process (i.e., converting a simulation netlist to a layout or schematic netlist), which may also be carried out by a set of computer-readable instructions configured to carry out such a conversion, preferably

TABLE 2

Netlists for the buffered polarity multiplexer of FIGS. 3(A)–(B).

| Schematic LVS Netlist | Layout LVS Netlist | Simulation Netlist |
| --- | --- | --- |
| INV1 A B | INV1 A B | INV1 A B |
|  |  | RES1 B E |
| PCH B C | PCH B C | PCH E F |
|  |  | C1 B GND |
|  |  | C2 E GND |
| NCH A C | NCH A C | NCH A C |
|  |  | RES2 F G |
|  |  | RES3 C G |
|  |  | RES4 G H |
| INV2 C D | INV2 C D | INV2 H D |
|  |  | C3 F GND |
|  |  | C4 G GND |
|  |  | C5 C GND |
|  |  | C6 H GND | automatically. The set of computer-readable instructions may be the same set that conducts the forward process. This method is essentially the reverse of the process for converting a layout or schematic netlist to a simulation netlist, and may comprise the steps of:

identifying and/or selecting a source library comprising a plurality of cell files, at least one cell file having at least one net-shorting element therein), copying the schematics in the selected source library to a destination library, opening the first or top cell in the destination library, searching the open cell file for RC networks and/or identifying RC network(s) (as defined above) therein, automatically converting and/or replacing any RC network identified therein with a net-shorting element, closing the first cell file after each RC network is replaced with a net-shorting element, opening the next cell file in the destination library, and repeating the search-and-replace steps described above.

This process continues (preferably automatically, carried out by a set of computer-readable instructions) until all cell files in the destination library have been searched and the RC networks therein have been replaced with net-shorting elements, thereby electronically (and preferably automatically) creating an accurate set of layout and/or schematic netlists. Essentially the same operating constraints and possible alternatives exist for the simulation-to-layout or simulation-to-schematic conversion process as for the layout-to-simulation or schematic-to-simulation conversion process.

Alternative Design Considerations

The net-shorting element could be netlisted as a new, separate device with resistance and capacitance properties, then merged into the simulation schematic by a netlist postprocessor.

Instead of a net-shorting element and a separate simulation schematic, the LVS tool (software) could be modified to have an "ignore" and/or "short" property on a generic device. In other words, when the LVS netlist is created from a circuit schematic, any resistors and inductors in the circuit schematic must be removed. One may "ignore" such circuit elements in the LVS netlist in accordance with known techniques. However, doing so disconnects the nodes that were connected to the ignored resistor(s) and/or inductor(s) from each other. Thus, it is also within the scope of the present invention to automatically replace an ignored or ignorable circuit element in a netlist or schematic with a "short" (e.g., a net-shorting element, an RC network as described above, a direct electrical connection, etc.), basically in accordance with the scheme shown in FIG. 2 and as described above (but replacing the phrase "net-shorting element" with the word "short").

As described above, the net-shorting element may also exist between (a) two bus junctions in the schematic, or (b) a bus junction and a circuit element in the schematic. Such an example is shown in FIGS. 3(A)–(B).

Where a cell or cell file is represented as a single component in a larger schematic to be electronically represented in a new, larger cell or cell file, the circuit(ry) and/or schematic(s) in the smaller cell or cell file typically do not contain net-shorting elements, whereas the larger schematic electronically represented in the new, larger cell/cell file typically does. This embodiment provides greatest benefit for simulating logic and/or routing circuitry between functional circuit blocks on a chip. Such logic and/or routing circuitry may include (but not necessarily be limited to) address busses, global word lines (in a memory, preferably a [static] random access memory), decoding circuitry and (global) clock busses.

What is claimed is:

1. A method of converting or translating a layout or schematic netlist to a simulation netlist, comprising the steps of:

(A) identifying net-shorting elements in the layout or schematic netlist;

(B) selecting the layout or schematic netlist from a source library;

(C) copying the layout or schematic netlist as a plurality of cell files to a destination library; and (D) replacing each of the net-shorting elements in the cell files with an RC network to generate the simulation netlist.

2. A method of converting or translating a layout or circuit schematic to a simulation netlist, comprising the steps of:

(A) identifying nodes in the layout or circuit schematic that have characteristic resistance and/or capacitance properties;

(B) inserting a net-shorting element in the corresponding layout or circuit schematic; and (C) replacing each of the net-shorting elements with an RC network to generate the simulation netlist.

3. A method of converting or translating a layout or circuit schematic to a simulation schematic, comprising the steps of:

(A) identifying nodes in the layout or circuit schematic that have characteristic resistance and/or capacitance properties;

(B) selecting the layout or circuit schematic from a source library;

(C) copying the layout or circuit schematic as a plurality of cell files to a destination library; and (D) replacing each of the nodes in the cell files with an RC network to generate the simulation schematic.

4. A method of converting or translating a simulation netlist to a layout or schematic netlist, comprising the steps of:

(A) identifying one or more RC networks in the simulation netlist; and (B) replacing at least one of the RC networks with a net-shorting element to generate the layout or schematic netlist.

5. A method of converting or translating a simulation schematic to a layout or schematic netlist, comprising the steps of:

(A) identifying RC networks in the simulation schematic; and (B) replacing at least one of the RC networks with a net-shorting element to generate the layout or schematic netlist.

6. A method of converting or translating a simulation schematic to a circuit schematic, comprising the steps of:

(A) identifying RC networks in the simulation schematic; and (B) replacing at least one of the RC networks with a node to generate the circuit schematic.

7. A computer-readable or processor-executable set of instructions for converting or translating (i) a layout or circuit schematic or schematic netlist thereof to a simulation schematic or a simulation netlist and (ii) the simulation schematic or the simulation netlist to the layout or circuit schematic or schematic netlist, the set of instructions comprising:

a) identifying net-shorting elements in the layout or schematic netlist, and replacing each of the net-shorting elements with an RC network to generate the simulation netlist;

b) identifying nodes in the layout or circuit schematic that have characteristic resistance and/or capacitance properties, inserting a net-shorting element in a corresponding layout or circuit schematic, and replacing each of the net-shorting elements with an RC network to generate the simulation netlist;

c) identifying nodes in the layout or circuit schematic that have characteristic resistance and/or capacitance properties, and replacing at least one of the nodes with an RC network to generate the simulation schematic;

d) identifying one or more RC networks in the simulation netlist, and replacing at least one of the RC networks with a net-shorting element to generate the schematic netlist;

e) identifying RC networks in the simulation schematic, and replacing at least one of the RC networks with a net-shorting element to generate the schematic netlist; and/or f) identifying RC networks in the simulation schematic, and replacing at least one of the RC networks with a node to generate the circuit schematic.

8. The method of claim 4, wherein (i) step (A) further comprises the sub-steps of:

selecting a source library comprising a plurality of cell files having at least one of the RC networks; and copying the simulation netlist in the selected source library to a destination library, and (ii) step (B) further comprises the sub-steps of:

closing a first cell file after replacing at least one of the RC networks with the net-shorting element;

opening a next cell file in the destination library; and repeating the replacing step until all of the cell files in the destination library have been searched and the RC networks have been replaced with the net-shorting element.

9. The method of claim 8, wherein converting or translating the simulation netlist to the layout or schematic netlist is carried out by a set of computer-readable or processor executable instructions.

10. The method of claim 1, wherein step (D) further comprises the sub-steps of:

closing a first cell file after replacing each of the net-shorting elements with at least one of the RC networks;

opening a next cell file in the destination library; and repeating the replacing step until all of the cell files in the destination library have been searched and the net-shorting elements have been replaced with the RC networks.

11. The method of claim 10, wherein converting or translating the simulation netlist to the layout or schematic netlist is carried out by a set of computer-readable or processor executable instructions.

12. The method of claim 1, further comprising the step of:

simulating at least one function or performance of a circuit in response to at least one input signal over a plurality of operational conditions.

13. The method of claim 2, further comprising the step of:

simulating at least one function or performance of a circuit in response to at least one-input signal over a plurality of operational conditions.

14. The method of claim 3, further comprising the step of:

simulating at least one function or performance of a circuit in response to at least one input signal over a plurality of operational conditions.

15. The method of claim 1, wherein converting or translating the layout or schematic netlist to the simulation netlist is carried out by a set of computer-readable or processor executable instructions.

16. The method of claim 2, wherein converting or translating the layout or circuit schematic to the simulation schematic is carried out by a set of computer-readable or processor executable instructions.

17. The method of claim 3, wherein converting or translating the layout or circuit schematic to the simulation schematic is carried out by a set of computer-readable or processor executable instructions.

18. The method of claim 4, wherein converting or translating the simulation netlist to the layout or schematic netlist is carried out by a set of computer-readable or processor executable instructions.

19. The method of claim 5, wherein converting or translating the simulation schematic to the layout or schematic netlist is carried out by a set of computer-readable or processor executable instructions.

20. The method of claim 6, wherein converting or translating the simulation schematic to the circuit schematic is carried out by a set of computer-readable or processor executable instructions.

* * * * *